(12) United States Patent
Bogner et al.

(10) Patent No.: US 7,183,661 B2
(45) Date of Patent: Feb. 27, 2007

(54) EPOXY-RESIN SYSTEMS, WHICH ARE RESISTANT TO AGING, MOULDING MATERIALS, COMPONENTS PRODUCED THEREFROM AND THE USE THEREOF

(75) Inventors: Georg Bogner, Lappersdorf (DE); Herbert Brunner, Regensburg (DE); Klaus Hoehn, Taufkirchen (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/296,848

(22) PCT Filed: May 16, 2001

(86) PCT No.: PCT/DE01/01848

§ 371 (c)(1),
(2), (4) Date: Nov. 27, 2002

(87) PCT Pub. No.: WO01/92396

PCT Pub. Date: Dec. 6, 2001

(65) Prior Publication Data

US 2003/0144414 A1 Jul. 31, 2003

(30) Foreign Application Priority Data

May 31, 2000 (DE) ................................ 100 27 206

(51) Int. Cl.
*H01L 23/29* (2006.01)
*B32B 27/38* (2006.01)

(52) U.S. Cl. ...................... 257/793; 257/788; 257/787; 428/413

(58) Field of Classification Search .................. 528/87, 528/88, 89, 93, 94, 103, 106, 112; 523/400; 428/413, 417, 418; 257/787, 788, 793
See application file for complete search history.

(56) References Cited

U.S. PATENT DOCUMENTS

| | | | | |
|---|---|---|---|---|
| 4,033,928 A | | 7/1977 | Randell et al. | |
| 5,026,751 A | * | 6/1991 | Bopp | 524/102 |
| 5,112,890 A | * | 5/1992 | Behrens et al. | 524/95 |
| 5,505,895 A | * | 4/1996 | Bull et al. | 264/327 |
| 5,616,633 A | * | 4/1997 | Wombwell et al. | 523/400 |
| 6,066,861 A | | 5/2000 | Hohn et al. | |
| 6,507,049 B1 | * | 1/2003 | Yeager et al. | 257/100 |

FOREIGN PATENT DOCUMENTS

| | | |
|---|---|---|
| DE | 3241767 | 5/1984 |
| DE | 38 76 173 T2 | 4/1993 |
| DE | 38 86 058 T2 | 5/1994 |
| DE | 19628409 | 11/1999 |
| EP | 0400898 | 12/1990 |
| EP | 0507333 | 10/1992 |
| JP | 02-170820 | * 7/1990 |

OTHER PUBLICATIONS

JPO abstract of JP 02-170820.*
Derwent abstract of JP 02/170820.*
Product data sheet for Ciba Tinuvin 144.*
Product data sheet for Ciba Tinuvin 326.*
Schrijver-Rzymelka, P., "Light Stabilizers", 1999, Munich, Germany, Carl Hanser Verlag, KU Kunststoffe, pp. 87-90. (Translation).

* cited by examiner

*Primary Examiner*—Michael J. Feely
(74) *Attorney, Agent, or Firm*—Fish & Richardson P.C.

(57) ABSTRACT

Epoxy-resin systems resistant to aging, molded materials and components generated from them, and their utilization.

An epoxy-resin system especially suitable in the application of casting-resin methods comprising an epoxide-containing A component based on a glycidyl ether or glycidyl ester and a B component containing anhydride as a hardener is proposed, where a sterically hindered amine is added to the A component as a stabilizer to prevent aging of molded materials. Light-emitting components potted with it exhibit increased aging stability, especially as with respect to light yield over time. The epoxy-resin system can also be used for encapsulants and molding compositions, and can be blended with acrylates, for all applications, particularly in the exterior.

25 Claims, 1 Drawing Sheet

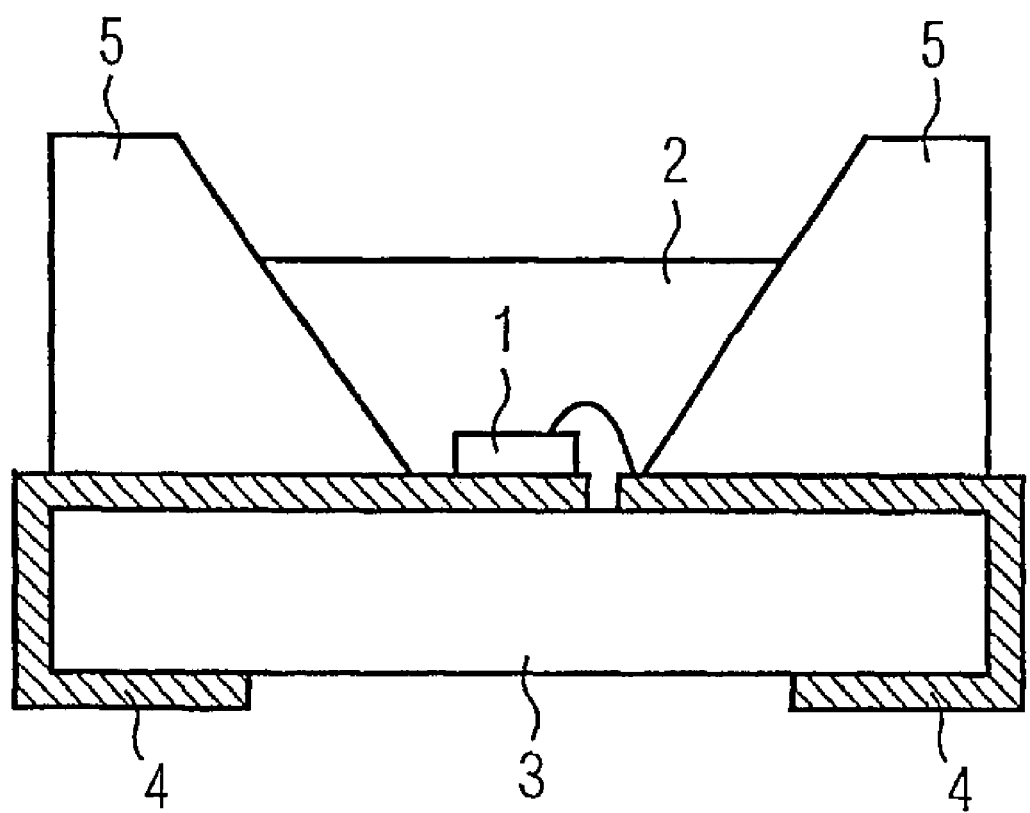

EPOXY-RESIN SYSTEMS, WHICH ARE RESISTANT TO AGING, MOULDING MATERIALS, COMPONENTS PRODUCED THEREFROM AND THE USE THEREOF

BACKGROUND

Epoxy-resin systems resistant to aging, molded materials and components generated from them, and their utilization.

To protect them from environmental influences, electrical and electronic components are potted or encapsulated with reaction resins through the application of casting-resin methods. The intention is to provide protection against mechanical, chemical and climatic environmental influences, particularly protection against impact, against breakage, against aggressive chemicals and against moisture, where such protection must be upheld at high environmental temperatures, which can reach approximately 130 degrees Celsius in the engine area of an automobile. Optoelectronic components, especially light-emitting components such as light-emitting diodes (LEDs), are exposed to particular stress, because the resin system used for encapsulation is subjected to additional radiation stress coming from the LED itself. In addition to having chemical and mechanical resistance, as well as a high degree of compound strength with a variety of substrates, such reaction-resin molded material must have a high degree of transparency, with an index of refraction nD greater than 1.5, if possible, and it must also exhibit resistance to light in terms of clouding, embrittlement and yellowing. The problem of increased radiation stress in light-emitting semiconductor components is amplified especially at decreasing wavelengths, increasing radiation doses of the component and the amplification of the radiation intensity in so-called high-power LEDs emitting at longer wavelengths, and for blue-emitting semiconductor components, for example, this results in the continuing lack of success in finding a satisfactory resin system resistant to aging that can be used for their encapsulation.

Commercially available LEDs are currently potted with two-component thermally cross-linking reaction resins based on epoxides, with anhydrides as hardeners. These substances are Theologically optimized and exhibit thermoreactive properties that allow for rational mass production. There the epoxy-resin component (A component) of these two-component reaction-resin systems consists of a low to medium-viscosity bisphenol A diglycidyl ether and a reactive epoxy diluent or polyfunctional epoxy novolak resins, as well as the additives and auxiliary substances common in casting resins. When used in LEDs, the A component may also be colored with organic pigments. Diffusely light-emitting components can exhibit special diffusor pastes based on inorganic pigments. With the aid of specific metal-salt accelerators containing organic carboxylate and alcoholate anions or ligands, two-component reaction-resin systems on anhydride/epoxide basis can be hardened. For the encapsulation of optoelectronic components, there are also two-component anhydride/epoxy casting-resin compositions based on cycloaliphatic epoxy resins and their blends with glycidyl-ether and glycidyl-ester resins. In special cases, acrylic-based encapsulants are also used.

However, it can be seen that the known casting compositions are not constructed to be sufficiently age-resistant to conform to the requirements for encapsulation of high-power LEDs, in particular, which are becoming ever more demanding. Even within the useful lives of the components, they already begin to exhibit clouding and yellowing, and can also exhibit brittleness, resulting in increasing porosity, as well as cracks, tears and reduced compound strength with the light-emitting component, including delamination. But molded materials from casting resins containing damage of this type result in a reduced light yield resulting in reduced optical-radiation characteristics, rendering them unsuitable for components in use constantly or according to customer specifications.

SUMMARY

The objective of the present invention is therefore to indicate reaction-resin systems for the encapsulation of components and particularly of optoelectric components exhibiting increased resistance to aging under radiation stress, preferably without negatively affecting the remaining characteristics of the reaction-resin systems, and of the molded materials generated from them.

This objective is achieved according to the invention by means of an epoxy resin having the characteristic contained in Claim 1. Preferable constructions of the invention, as well as of the components generated from it, are contained in succeeding claims.

The epoxy-resin system according to the invention is suitable for casting-resin applications, pottant and encapsulant compositions and for lacquers. It exhibits significantly improved resistance against the aging of molded materials when subjected to additional radiation stress. Since the formation of clouding, tears and cracks are especially prevented, this also results in increased resistance to weather conditions, because the named aging occurrences attributable to light lead to an increasing lack of resistance to moisture in materials, especially components, which are potted, encapsulated or sealed with it.

DETAILED DESCRIPTION

The epoxy resin system can incorporate an A component with epoxy resin and a B component with a hardener, usually a carboxylic anhydride. Aside from these basic components, the epoxy-resin system may contain further components known for it that are suitable to a particular application.

Surprisingly, it has been shown that a sterically hindered amine added as a stabilizer exhibits good compatibility with the A component, and does not affect the shelf life of the A component. Storage-stable A components are obtained, which in turn produces reaction-resin systems that can be stored unaltered with respect to processing—mixture, metering/application, hardening—and to their characteristics, for periods up to several months, and these lead to molded materials that, while maintaining otherwise unchanged characteristics, exhibit significant resistance to aging from temperature, moisture and radiation stress. The molded materials obtained can be manufactured to a water-clear degree of transparency, and they exhibit an extremely low tendency for yellowing, clouding or embrittlement. This is attributable to the positive, light-stabilizing effect of the sterically hindered amines, which were already known as light stabilizers for use in thermoplastic polyolefin plastic materials under the name HALS (Hindered Amine Light Stabilizers). Amines and their derivatives are known as hardeners and hardening accelerators for reaction resin systems, and they generally deliver molded materials that are colored and highly susceptible to yellowing. It is therefore surprising that despite this known reaction of amines, storage-stable reaction-resin systems are still obtained with sterically hindered amines. It is assumed that steric shielding of the free electron pair in the nitrogen atom of the amine and the reduced basicity of the compounds has the effect of preventing the characteristics of reaction resins for use in large-scale manufacturing processes, and thus the characteristics of reaction resins, from being negatively influenced.

The sterically hindered amine is a secondary or tertiary amine or amine oxide, which is shielded for chemical reactions by sterically voluminous groups in particular. Sterically demanding groups can be substituents containing tertiary carbon atoms with sterically demanding aliphatic, cycloaliphatic and aromatic substituents at the alpha position of the nitrogen. Sterically demanding amines are also heterocyclic amines, which are preferably also sterically shielded at the alpha position. The third substituent at the nitrogen can be an alkyl, an aryl, an alkylaryl or a cycloalkyl group. Also preferred are corresponding groups bound to the nitrogen via an oxygen atom, or groups that have oxygen atoms in their chains, such as ether groups or ester groups.

Especially preferred are amines with reduced or adjusted basicity, where one substituent on the nitrogen is a group bound via an oxygen atom. Especially preferred are, for example, amine oxide alkyl compounds of the general structure (R1)(R2)N—O—R3, where R1 and R2, independently from each other, denote alkyl, aryl or alkylaryl groups, or where R1 and R2 combined is a divalent substituent that forms a ring, or a heterocyclic ring, in combination with the nitrogen atom. R3 can again denote the third substituent described above.

These amine oxide alkyl compounds exhibit particularly low basicity; this reduction is brought about by the steric shielding of the free electron pair on the one hand, and also by the inductive effect of the oxygen. These amines exhibit particularly good compatibility with epoxy A components. When the reaction-resin systems are hardened, they have no negative influence on the hardening reaction, and they yield casting-resin molded materials where the amine is actually not chemically bound, but still safely enclosed and protected from evaporation due to possible hydrogen bridging in the cross-linked structure and a relatively high molecular weight. The molded materials are water-clear/transparent and exhibit a markedly improved resistance to aging in moist environments at temperatures above 100° C. and under added radiation stress.

For the invention, it is sufficient that a proportionally small amount of the amine used as a stabilizer be mixed into the A component, where an amount of 0.1 to 5.0 percent weight for weight, preferably 0.1 to 1.0 percent weight for weight, is sufficient. As the hardener component, or B component, an anhydride, which is preferably derived from a cycloaliphatic or aromatic di- or tetracarboxylic acid, is used. It can contain the carboxylic acid anhydride as its principal component and also acid esters that are obtained from the partial reaction of these anhydrides with aliphatic alcohol.

The B components can contain phosphorus-containing oxidation stabilizers. For optoelectronic applications, metal salts are preferably used as accelerators.

The epoxy-resin system is very good for casting-resin applications and, at processing temperature, exhibits sufficiently low viscosity, good usage characteristics with a sufficiently long pot life, and it can be applied free of streaks or bubbles. It comprises an epoxide-containing A component and a B component containing anhydride as a hardener. The A component contains more than 60 percent weight for weight of a glycidyl-ether or glycidyl-ester-based epoxide as well as the sterically hindered amine as a stabilizer to prevent aging of the molded materials from added radiation stress.

In the invention it is preferable to use a sterically hindered phenol derivative in the A component as another stabilizer. This will stabilize the casting-resin molded material against thermo-oxidative attacks.

Contained in the A component as an epoxide is preferably a diglycidyl ether, a diglycidyl ester or a cycloaliphatic epoxide, or a mixture of these, as the principal component.

Preferably, diglycidyl ether of bisphenol A and, as a secondary component, a polyfunctional epoxy novolak resin, together making up more than 80 percent weight for weight, are included.

There may additionally be included common additives for casting resins, which are selected from among reactive diluents, particularly those based on monoglycidyl ethers, alcohols, bonding agents, flow promoters, deaerators, optical brighteners, light absorbers, release agents or thixotropic agents. Altogether, for casting-resin systems according to the invention, this leads to the following compositions for the A component, which are indicated in the following table with their respective limit values:

Epoxy resins based on glycidyl ethers or glycidyl esters, and cycloaliphatic epoxy resins >50%
Epoxy novolak <40%
Reactive diluents (monoglycidyl ethers)<10%
Alcohols <10%
Sterically-hindered amine <5.0%
Oxidation stabilizer <5.0%
Bonding agent <5.0%
Light absorber <0.5%
Silicone-based flow promoters <1.0%
Silicone-based deaerators <1.0%
Optical brighteners <1.0%
Internal release agents for the housing <1.0%
Thixotropic agents <10%
Diffusors (inorganic particles)<30%
Organic dyes/pigments <10%
Inorganic luminescent substances <40%

Using the glycidyl ethers as the principal component, casting-resin molding materials with high glass-transition temperatures of 110 and, in one exemplary embodiment, 130 degrees Celsius and more can be obtained that display the high age resistance according to the invention. The diglycidyl ethers exhibit preferred reduced chlorine contents, which has further positive effects; in particular, it brings about a lower tendency for yellowing of the casting-resin molding material and makes the molding materials less susceptible to delamination. Epoxy resins according to the invention exhibit chlorine contents of less than 250 ppm of hydrolyzable chlorine and less than 1000 ppm of total chlorine.

When hardening the epoxy-resin system, stoichiometric amounts of A and B components are preferably used, as this is best for its interaction with moisture and for the electrical characteristic data in the component. With respect to the A component, 0.7 to 1.2 reaction equivalents of B component are used. In processes adapted to mass production, however, the preferred epoxy-resin systems used have a shortage of B component comprising 0.7 to 0.9 reaction equivalents present. This takes into account both the intramolecular reaction of the epoxides and a certain amount of hydrolysis, so that altogether a stoichiometric reaction of reactive epoxide groups with the corresponding anhydride groups can take place. The molded materials thus created exhibit low moisture uptake as well as high thermal and thermo-mechanical stability. This makes the casting-resin molded materials suitable also for SMD (Surface Mount Device) components, as these are exposed to high temperatures with distinctive temperature profiles during a soldering process. The low moisture uptake and a glass-transition temperature of over 130° C. makes the casting-resin molded materials suitable for use in the automotive sector. The high degree of transparency and the resistance to aging in terms of optical properties makes the casting-resin molded materials suitable especially for use in optoelectronics and especially for use in the encapsulation of optoelectronic components such as LEDs, for example. The high photochemical stability of the casting-resin molded materials allows the use of the epoxy-resin systems for the potting of high-power light-emitting semiconductor components, especially those emitting at wavelengths shorter than 500 nm. That makes them suitable for potting blue-emitting LEDs, preferably in combination with luminescence-converting substances. These are admixed to the epoxy resin, so that the blue light coming from the semiconductor element can be turned into a white-luminescent LED through luminescence conversion.

Another advantage that comes particularly from the use of low-chlorine, hydroxyl-free epoxy-based resins is entailed in the lower moisture uptake, a markedly lowered E-modulus and a lower thermal expansion coefficient at almost unchanged glass-transition temperature. If a light-emitting component is encapsulated with the epoxy-resin system according to the invention, that reduces the thermomechanical stress exerted on the component by the encapsulation. The danger of mechanically-caused component degradation is thereby also decreased further, and the total package is further stabilized. In addition, the low chlorine content of the epoxy-resin system used for potting works to counteract the corrosion of corrodible structures on the component. The deciding factor here is primarily the low hydrolyzable-chlorine content. During a long-term climate test with comparable chlorine-containing resin systems, it was shown that under harsher temperature/moisture conditions and under electric stress, chloride ions and chlorine-containing species can be released, which can lead to clouding at the interface between the chip of the semiconductorcomponent and the potting composition. This results in a reduction of the luminous intensity of light-emitting components. In addition, hydrolysis activity such as that with chlorine can reduce the strength of the bond to the chip to such an extent that delamination occurs at the potting composition-chip interface, reducing yet further the luminous intensity. With respect to the moisture stability of epoxy-resin systems according to the invention, it was found that the casting-resin molded materials based on hydroxyl-free bisphenol A epoxy resins during moisture uptake exhibited a slight lowering of the glass-transition temperature by only a few degrees Celsius, a lowering that is much smaller than in traditional potting compositions.

A further advantageous component of epoxy-resin systems according to the invention are light-screening agents, especially in the A component. These absorb energy-rich electromagnetic radiation and release it after radiation-free deactivation. Such light-screening compounds, of the benzophenone type or on the basis of triazines, are already known for thermoplastic substances. The absorbers added in accordance with the invention are selected so that no absorption of light takes place at wavelengths above 420 nm.

To keep absorption by the light-screening agents of the radiation to be used at a minimum, their concentration, or portion of the A component, is kept as low as possible. A preferable concentration of light-screening agents in an epoxy-resin system used in the transparent encapsulation of optoelectronic components is in a region of less than 0.2 percent weight for weight.

In the following, the invention is described in more detail by means of exemplary embodiments and the FIGURE pertaining thereto.

The FIGURE shows a schematic cross-section of a known LED with a casting-resin encapsulation.

Five different A components are indicated, where exemplary embodiments one and two represent preferable base compositions, to which sterically hindered amines and sterically hindered phenols, respectively, are added in exemplary embodiments three, four and five. For all five exemplary embodiments, the same B component is used; it is a methylhexahydrophthalic acid anhydride modified with an acid ester. The acid ester is a formulation component of the hardener, wherein up to 50% of the difunctional anhydride group are transformed into a half-ester with mono- or polyvalent alcohols. Hexahydrophthalic acid is a preferable base anhydride to use for optoelectronic applications.

With each of the epoxy-resin systems from exemplary embodiments one through five, molded padding is fabricated and cured, the molds are then tested for their thermomechanical properties and for climatic resistance, particularly moisture uptake. In addition, the epoxy-resin systems are used to pot blue-emitting LEDs. The aging stability of the LEDs is tested in continuous operation by means of the luminous intensity emitted.

It is generally assumed of amines that they lead to the gellation of the epoxy resin component and for that reason end up not being used in as a formulation component in storage-stable epoxy A components. The reduced reactivity of amine stabilizers in the epoxy resin rests primarily on the fact that the reactive amine function is shielded by means of sterically demanding side groups. Through the targeted selection of electrophilic groups that are either bound directly to the amine nitrogen or are located in β position to it, the basicity of the amine nitrogen is further reduced, thereby also reducing the reactivity. DSC (Dynamic Scanning Calorimetry) examinations on the reactive behavior of epoxy components stabilized with HALS, especially after having stored the resins at 80° C., prove their stability in storage. At 30° C., the shelf life is, surprisingly, longer than 6 months.

In accelerated-aging tests under short-wave radiation of between 360 nm and 500 nm, and at energy-rich radiation>420 nm (UV-B filter), the efficacy of HALS stabilizers in epoxy-anhydride molded materials was demonstrated.

FIG. 1 shows the schematic construction of an LED, which here is constructed SMD-capable. This semiconductor component 1, that is, the diode itself, is mounted on a leadframe 4 and electronically connected to it. The plastic housing 3,5 preferably made from thermoplastic material, together with the transparent casting resin 2, constitutes the SMD package that protects the component from adverse environmental influences, thereby assuring its capacity to function throughout its useful life. Above the casting-resin encapsulation 2, an optical lens may be affixed subsequently if additional bundling of radiation is desired.

First Exemplary Embodiment

For the A component of the first exemplary embodiment, the following components, indicated at weight-for-weight percentages, are mixed homogeneously.

Bisphenol A diglycidyl ether (Rütapox VE3748-Bakelite) 98.98%

Deaerator (BYK A-506, BYK Chemie) 0.2%

Bonding agent (Silane A-187, ABCR GmbH) 0.80%

Optical brightener (Master Batch 09, CIBASCISIN) 0.016%

After reaction with the named B component, a molded material exhibiting a glass-transition temperature of 125 to 126 degrees Celsius is obtained. After 6 weeks of storage in cold water, the moisture uptake is 0.65 percent, weight for weight, where the associated decrease in the glass-transition temperature to only 124 degrees Celsius is remarkably low. The E-modulus (tensile, 3 K/minute, 1 Hz) is 2660 MPa. The thermal expansion coefficient CTE (−50/+50° C.) is 59.7 ppm/K. The cold-water intake after one week at 23° C. is 0.31%.

These very good thermomechanical properties in themselves, as well as the high degree of resistance to humidity, are attributed to the low content of hydroxyl groups in the specific bisphenol A diglycidyl ether product (Rütapox VE 9748).

Second Exemplary Embodiment

The A component of the second exemplary embodiment is modified from that of the first exemplary embodiment in terms of its epoxy component. It has the following composition (indicated in weight-for-weight percentages).

| | |
|---|---|
| Bisphenol A diglycidyl ether (Rütapox VE3748) | 78.98% |
| Epoxy novolak resin (D.E.N., DOW) | 20.00% |
| Deaerator (BYK A-506, (Deaerator, BYK Chemie) | 0.20% |
| Bonding agent (Silane A-187, ABCR GmbH) | 0.80% |
| Optical brightener (Master Batch 09, CIBASCISIN) | 0.016% |

The A component according to the second example is transformed with the B component indicated above. The thermomechanical properties are determined from the corresponding molds. The casting-resin molded material exhibits a glass-transition temperature of up to 141° C. depending on the hardening conditions. After 6 weeks of storage in cold water, the moisture uptake is 0.67 percent, where the glass-transition temperature deceases by just 4° C. to 137° C. The E-modulus (tensile, 3 K/minute, 1 Hz) is 2570 MPa. A thermal expansion coefficient CTE (−50/+50° C.) of 57.4 ppm/K was determined. After one week of storage in cold water at 23° C., a cold-water intake of 0.36% is determined.

Third Exemplary Embodiment

For this example, 0.2 percent, weight for weight, of a sterically hindered N-oxyalkyl amine (Tinuvin 123, CIBA Specialty) is added to the A component from

EXAMPLE 1

A storage-stable A component with almost unchanged reactive behavior and almost unchanged glass-transition temperature is obtained in the resulting molded material. In light-emitting diodes potted with this material, improved resistance to aging is observed after exposure to energy-rich electromagnetic radiation; the reduction in luminous intensity attributable to aging is significantly better than in Example 1.

Fourth Exemplary Embodiment 0.1 percent, weight for weight, of Tinuvin 123 (CIBA Specialty) is added to the A component from Example 2. Here also, a storage-stable A component with almost unchanged reactive behavior and almost unchanged glass-transition temperature is obtained in the resulting molded material. Improved resistance to aging in LEDs potted with it is observed after exposure to energy-rich electromagnetic radiation.

Fifth Exemplary Embodiment

To the A component from Example 2 is added 0.2 percent, weight for weight, of Tinuvin 123 (CIBA Specialty), as well as 0.3% of a sterically hindered phenol derivative (Akcros Chemicals). The same behavior as in the fourth exemplary embodiment was measured; in addition, the aging stability and sensitivity to oxidation was lowered further.

It is thus demonstrated that with the epoxy-resin systems according to the invention, casting-resin potting compositions become available that are perfectly suitable for potting electrical and electronic components, especially components that are exposed to high thermal stress, increased moisture uptake and radiation stress. The molded materials made from them can be produced at high glass-transition temperatures and exhibit increased resistance to aging, particularly in light, compared to known molded materials. The high glass-transition temperatures also make them especially useful for application in SMD processes, since components encapsulated with them survive soldering treatment unharmed.

The transparent molded materials described are especially suitable for optoelectronic components. Because of the high Tg, the epoxy resins can also be applied for potting components and sensors in the automotive sector. Because of the good resistance to weather conditions with respect to temperature, moisture and radiation, the epoxy potting compositions are also suitable for exterior application areas. Lacquers and molding compositions based on epoxy resins with HALS stabilizers are also advantageous and, when compared to corresponding known compositions without the HALS stabilizers, they exhibit the indicated improved resistance to radiation and weather conditions.

What is claimed is:

1. An apparatus comprising:
   an optoelectronic component; and
   an epoxy-resin system containing a first component including a sterically hindered amine as a stabilizer to prevent aging of molded material due to radiation and a second component including an anhydride as a hardener and corresponding ester of the anhydride, wherein the epoxy-resin system is arranged in an optical path of the optoelectronic component and is transparent for the radiation of the optoelectronic component.

2. The apparatus of claim 1, wherein:
   the sterically hindered amine has a general formula of $R_1R_2N$—O—$R_3$, where $R_1$ and $R_2$, independently from each other, denote alkyl, aryl or alkylaryl groups, or where $R_1$ and $R_2$ combined is a divalent substituent that forms a ring, or a heterocyclic ring, in combination with the nitrogen atom and where $R_3$ denotes an alkyl group, an aryl group, an alkylaryl group, a cycloalkyl group or an oxygen containing group, where the oxygen containing group is one of an aliphatic group, a cycloaliphatic group, the alkylaryl group or the aryl group.

3. The apparatus of claim 2, wherein the first component contains more than 60 percent weight for weight of a glycidyl-ether or glycidyl-ester-based epoxide.

4. The apparatus of claim 3, wherein the anhydride is an anhydride of hexahydrophthalic acid.

5. The apparatus of claim 2, wherein the $R_3$ denotes an alkyl or alkoxy group of 1–18 C atoms, which can contain one or two functional groups, with the exception of NH.

6. The apparatus of claim 2, wherein the sterically hindered amine is present in the first component at 0.1 to 5.0 percent weight for weight.

7. The apparatus of claim 2, wherein the second component includes an anhydride of a cycloaliphatic or aromatic di- or tetracarboxylic acid as a main component.

8. The apparatus of claim 7, wherein the corresponding ester of the anhydride is an acid ester that is obtained when an aliphatic alcohol is partially reacted with the anhydride.

9. The apparatus of claim 2, wherein the second component further comprises organophosphoric oxidation stabilizers and accelerators.

10. The apparatus of claim 2, wherein the first component further comprises a sterically hindered phenol derivative as a second stabilizer.

11. The apparatus of claim 2, wherein the first component further comprises a diglycidyl ether, a diglycidyl ester, a cycloaliphatic epoxide, or a mixture of these as a primary component.

12. The apparatus of claim 2, wherein the first component further comprises a diglycidyl ether of bisphenol A as a primary component and a polyfunctional epoxy novolak resin as a secondary component, together making up more than 80 percent weight for weight.

13. The apparatus of claim 2, wherein:
the epoxy-resin system has a glass transition temperature of at least 130° C.

14. The apparatus of claim 2, wherein the first component has a low hydrolyzable-chlorine content.

15. The apparatus of claim 2, wherein the first component further comprises a light-screening agent.

16. The apparatus of claim 15, wherein the light-screening agent is a benzophenone or a triazine.

17. The apparatus of claim 15, wherein the light-screening agent is selected so that no absorption of light takes place above 420 nm.

18. The apparatus of claim 15, wherein the light-screening agent is less than 0.2 percent weight for weight.

19. The apparatus of claim 1, wherein the optoelectronic component is a light-emitting diode.

20. The apparatus of claim 19, wherein the optoelectronic component has an emission wavelength in the blue spectral region below 500 nm.

21. The apparatus of claim 19, wherein the light-emitting diode is a white-luminescent light emitting diode.

22. The apparatus of claim 1, wherein the epoxy-resin system, further comprises a light-screening agent, which is selected so that no absorption of light takes place above 420 nm.

23. An apparatus comprising:
an epoxy-resin system containing a first component including a sterically hindered amine as a stabilizer and a second component including an anhydride as a hardener and a corresponding ester of the anhydride; and
a surface mount device potted with the epoxy resin system, wherein the sterically hindered amine has the general formula of $R_1R_2N—O—R_3$, where $R_1$ and $R_2$ independently from each other, denote alkyl, aryl or alkylaryl groups, or where $R_1$ and $R_2$ combined is a divalent substituent that forms a ring or a heterocyclic ring, in combination with the nitrogen atom and where $R_3$ denotes an alkyl group, an aryl group, an alkylaryl group, a cycloalkyl group or an oxygen containing group, where the oxygen containing group is one of an aliphatic group, a cycloaliphatic group, the alkylaryl group or the aryl group.

24. An apparatus comprising:
a white-luminescent light-emitting diode; and
an epoxy-resin system containing a first component including a sterically hindered amine as a stabilizer, the sterically hindered amine having the general formula of $R_1R_2N—O—R_3$, where $R_1$ and $R_2$, independently from each other, denote alkyl, aryl or alkylaryl groups, or where $R_1$ and $R_2$ combined is a divalent substituent that forms a ring or a heterocyclic ring, in combination with the nitrogen atom and where $R_3$ denotes an alkyl group, an aryl group, an alkylaryl group, a cycloalkyl group or an oxygen containing group, where the oxygen containing group is one of an aliphatic group, a cycloaliphatic group, the alkylaryl group or the aryl group and a second component including an anhydride as a hardener,
wherein the epoxy-resin system is arranged in an optical path of the white-luminescent light-emitting diode and is transparent to the radiation of the white-luminescent light-emitting diode; and
the epoxy-resin system is a transparent epoxy-resin casting system.

25. An apparatus comprising:
a surface mountable device: and
a transparent epoxy resin system containing a first component including a sterically hindered amine as a stabilizer and a second component including an anhydride as a hardener, wherein the epoxy resin system covers at least part of the surface mountable device so that the surface mountable device is visible through the transparent epoxy and the sterically hindered amine has the general formula of $R_1R_2N—O—R_3$, where $R_1$ and $R_2$, independently from each other, denote alkyl, aryl or alkylaryl groups, or where $R_1$ and $R_2$ combined is a divalent substituent that forms a ring or a heterocyclic ring, in combination with the nitrogen atom and where $R_3$ denotes an alkyl group, an aryl group, an alkylaryl group, a cycloalkyl group or an oxygen containing group, where the oxygen containing group is one of an aliphatic group, a cycloaliphatic group, the alkylaryl group or the aryl group.

* * * * *